(12) United States Patent
Liu

(10) Patent No.: US 12,288,759 B2
(45) Date of Patent: Apr. 29, 2025

(54) SEMICONDUCTOR REDISTRIBUTION STRUCTURE WITH INTEGRATED TEST PAD AND METHOD FOR PREPARING THE SAME

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 497 days.

(21) Appl. No.: 17/658,037

(22) Filed: Apr. 5, 2022

(65) Prior Publication Data
US 2023/0056623 A1 Feb. 23, 2023

(30) Foreign Application Priority Data
Aug. 19, 2021 (CN) .......................... 202110956294.5

(51) Int. Cl.
*H01L 23/00* (2006.01)
*H01L 21/66* (2006.01)

(52) U.S. Cl.
CPC .............. *H01L 24/05* (2013.01); *H01L 22/32* (2013.01); *H01L 24/03* (2013.01); *H01L 24/06* (2013.01); *H01L 2224/02125* (2013.01); *H01L 2224/0214* (2013.01); *H01L 2224/02145* (2013.01); *H01L 2224/02311* (2013.01); *H01L 2224/0233* (2013.01); *H01L 2224/0235* (2013.01); *H01L 2224/0239* (2013.01);
(Continued)

(58) Field of Classification Search
CPC ......... H01L 24/05; H01L 22/32; H01L 24/03; H01L 24/06; H01L 2224/02125; H01L 2224/0214; H01L 2224/02145; H01L 2224/02311; H01L 2224/0233; H01L 2224/0235; H01L 2224/0239; H01L 2224/05548; H01L 2224/05551; H01L 2224/05553; H01L 2224/05557; H01L 2224/05569; H01L 2224/06515; H01L 2924/1436; H01L 2924/37001
See application file for complete search history.

(56) References Cited

U.S. PATENT DOCUMENTS

2005/0116338 A1* 6/2005 Hirai ....................... H01L 22/32
257/734
2007/0117348 A1* 5/2007 Ramanathan ........... H01L 24/03
257/E21.705
(Continued)

FOREIGN PATENT DOCUMENTS

CN 102054809 B 12/2012

*Primary Examiner* — Nduka E Ojeh
*Assistant Examiner* — Ethan Edward Cutler
(74) *Attorney, Agent, or Firm* — Syncoda LLC; Feng Ma

(57) ABSTRACT

A semiconductor structure includes: a substrate, a conductive pattern layer, a support layer and a re-distribution layer. The conductive pattern layer is arranged on the substrate. The support layer covers the conductive pattern layer and is provided with a via hole. The re-distribution layer is arranged on the support, and the re-distribution layer includes a test pad at least located in the via hole. The test pad includes a plurality of test contact portions and a plurality of recesses that are arranged alternately and connected mutually, and the recess is in corresponding contact with a portion of the conductive pattern layer in the via hole.

18 Claims, 12 Drawing Sheets

(52) U.S. Cl.
CPC .............. *H01L 2224/05548* (2013.01); *H01L 2224/05551* (2013.01); *H01L 2224/05553* (2013.01); *H01L 2224/05557* (2013.01); *H01L 2224/05569* (2013.01); *H01L 2224/06515* (2013.01); *H01L 2924/1436* (2013.01); *H01L 2924/37001* (2013.01)

(56) References Cited

U.S. PATENT DOCUMENTS

| | | | |
|---|---|---|---|
| 2012/0315758 A1* | 12/2012 | Sakurai | H01L 21/76898 257/E21.585 |
| 2016/0293499 A1* | 10/2016 | Nunokawa | H01L 21/52 |
| 2019/0096762 A1* | 3/2019 | Stahl | H01L 21/76879 |
| 2019/0103327 A1* | 4/2019 | Horibe | H01L 22/14 |

\* cited by examiner (a)

(b)

SEMICONDUCTOR REDISTRIBUTION STRUCTURE WITH INTEGRATED TEST PAD AND METHOD FOR PREPARING THE SAME

CROSS-REFERENCE TO RELATED APPLICATION

The present application claims priority to Chinese Patent Application No. 202110956294.5 filed on Aug. 19, 2021, the disclosure of which is hereby incorporated by reference in its entirety.

BACKGROUND

With the rapid development of semiconductor technologies, a Re-Distribution Layer (RDL) has been widely applied to the field of chip package. However, in the field of Dynamic Random Access Memory (DRAM), a top metal layer connected to the RDL is easy to be damaged in Wafer Acceptance Testing (WAT), resulting in a decrease of the yield of the DRAM. Moreover, with further reduction of a size of an integrated circuit in the DRAM, it is difficult to have a large space in the DRAM for local RDL. Therefore, applications of the RDL in DRAM-related fields have always been limited.

SUMMARY

The disclosure relates to semiconductor integrated circuit manufacturing technologies, and particularly to a semiconductor structure and a method for preparing the same.

According to one aspect of some embodiments of the disclosure, there is provided a semiconductor structure. The semiconductor structure may include: a substrate, a conductive pattern layer, a support layer, and a Re-Distribution Layer (RDL). The conductive pattern layer is arranged on the substrate. The support layer covers the conductive pattern layer and is provided with a via hole. The RDL is arranged on the support, and includes a test pad at least located in the via hole. The test pad includes a plurality of test contact portions and a plurality of recesses that are arranged alternately and connected mutually, and the recess is in corresponding contact with a portion of the conductive pattern layer in the via hole.

According to another aspect of some embodiments of the disclosure, there is provided a method for preparing a semiconductor structure, to prepare the semiconductor structure in the foregoing embodiments. The method for preparing a semiconductor structure may include the following steps.

A substrate is provided, and a conductive pattern layer is formed on the substrate.

A support layer is formed on the conductive pattern layer, and a via hole is formed in the support layer.

An RDL is formed on the support layer, in which the RDL includes a test pad that is at least located in the via hole, the test pad including a plurality of test contact portions and a plurality of recesses that are arranged alternately and connected mutually, and the recess is in corresponding contact with a portion of the conductive pattern layer in the via hole.

BRIEF DESCRIPTION OF THE DRAWINGS

In order to describe the technical solutions in the embodiments of the disclosure or a conventional art more clearly, the drawings required to be used in descriptions about the embodiments or the conventional art will be simply introduced below. It is apparent that the drawings described below are only some embodiments of the disclosure. Other drawings may further be obtained by those of ordinary skilled in the art according to these drawings without creative work.

DETAILED DESCRIPTION

Figure 1:
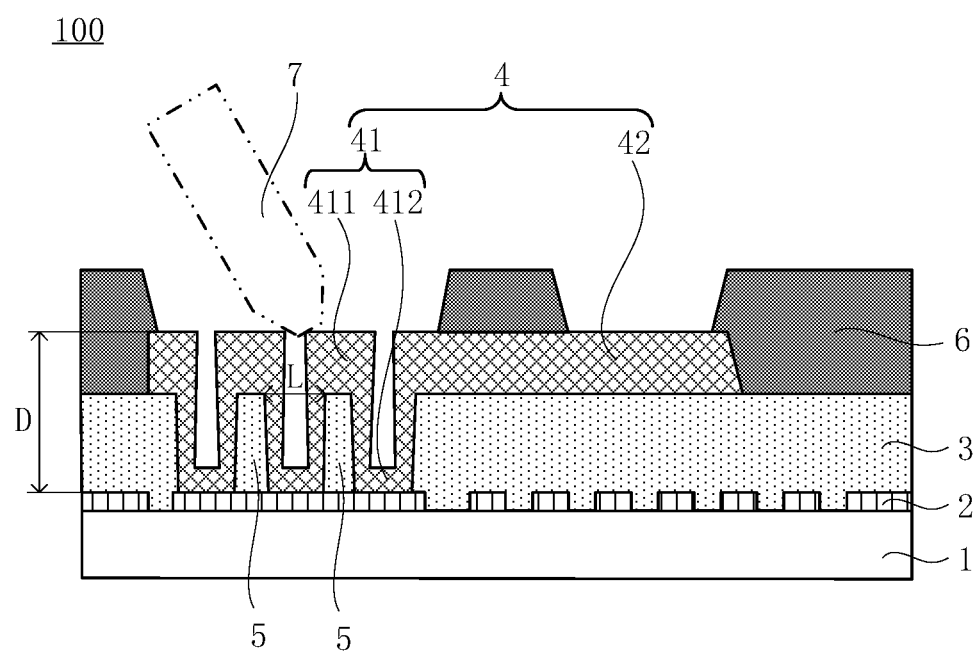
FIG. 1 is a schematic sectional view of a semiconductor structure according to an embodiment.

In order to make the disclosure convenient to understand, the disclosure will be described more comprehensively below with reference to the related drawings. The drawings show embodiments of the disclosure. However, the disclosure may be implemented in various forms and is not limited to the embodiments described herein. On the contrary, these embodiments are provided to make the contents disclosed in the disclosure understood more thoroughly and comprehensively.

Unless otherwise defined, all technical and scientific terms used herein have the same meanings as commonly understood by those skilled in the art to which the disclosure belongs. Herein, terms used in the description of the disclosure are only for the purpose of describing specific embodiments and not intended to limit the disclosure.

It is to be understood that when an element or layer is described as being "above", "adjacent to", "connected to", or "coupled to" another element or layer, the element or layer is directly above, adjacent to, connected to or coupled to the other element or layer, or there may be an intermediate element or layer. On the contrary, when an element is described as being "directly on", "directly adjacent to", "directly connected to" or "directly coupled to" another element or layer, there is no intermediate element or layer.

Spatially relational terms such as "below", "under", "lower", "beneath", "above", and "upper" may be used herein for describing a relationship between one element or feature and another element or feature illustrated in the figures. It is to be understood that, in addition to the orientation shown in the figures, the spatially relational terms further include different orientations of devices in use and operation. For example, if the devices in the figures are put upside down, elements or features described as being "under" or "beneath" or "below" other elements or features will be oriented to be "on" the other elements or features. Therefore, the exemplary terms "under" and "below" may include both upper and lower orientations. Moreover, the device may include otherwise orientation (such as rotation by 90 degrees or in other orientations) and the spatial descriptors used herein may be interpreted accordingly.

As used herein, singular forms "a", "an", and "the/said" may include the plural forms, unless other forms are indicated clearly in the context. It is also to be understood that, terms such as "comprising/containing" or "having" appoint existence of the described features, wholes, steps, operations, components, parts or combinations of them, but not excluding the possibility of existence or adding of one or more other features, wholes, steps, operations, components, parts or combinations of them. Meanwhile, in the specification, the term "and/or" includes any and all combinations of the related listed items.

The embodiments of the disclosure are described with reference to a schematic cross section diagram of a preferred embodiment (and an intermediate structure) of the disclosure herein, so that change of shown shapes due to a manufacturing technology and/or tolerance may be predicted. Therefore, the embodiments of the disclosure should not be limited to specific shapes of shown areas, but include shape deviation due to the manufacturing technology. Areas shown in the figures are schematic substantially, their shapes do not represent actual shapes of areas of a device, and there is no limitation on the scope of the disclosure.

Wafer Acceptance Testing (WAT) refers to performing electrical measurement on each chip on a wafer to check whether a processing technology of each stage of the chip meets the standards. The WAT includes various testings such as chemical testing, physical testing or performance testing, to determine whether the chip meets the requirements of the design specification or contract.

Exemplarily, in the WAT for a DRAM, an RDL may be arranged in the DRAM, and the RDL is then used to lead out corresponding electrical property of a conductive pattern layer that needs to be tested for an electrical performance, thereby facilitating measurement.

Figure 2:
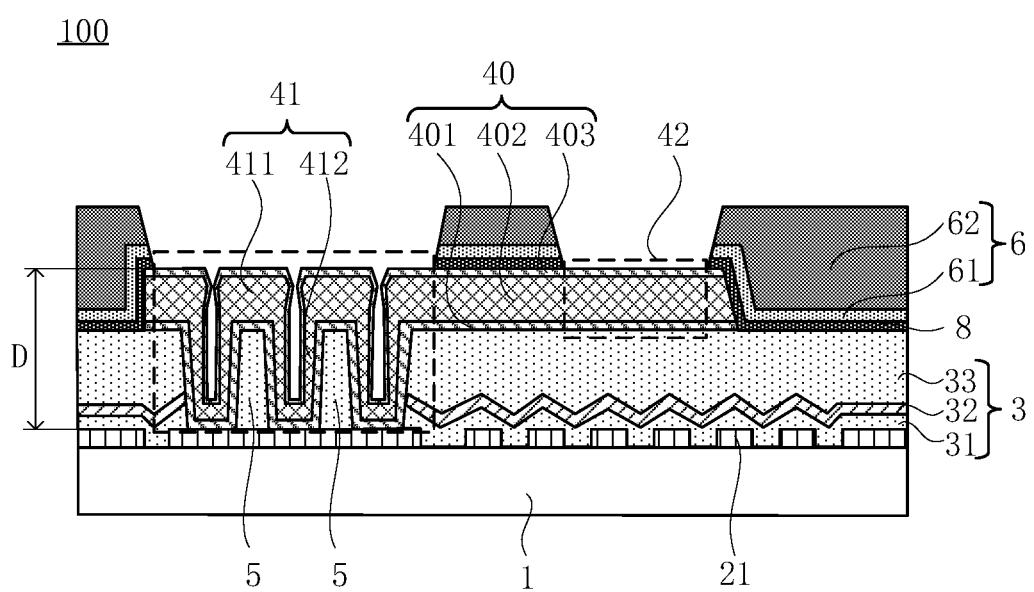
FIG. 2 is a schematic sectional view of another semiconductor structure according to an embodiment.

On such a basis, referring to FIG. 1 and FIG. 2, some embodiments of the disclosure provide a semiconductor structure 100. The semiconductor structure 100 includes: a substrate 1, a conductive pattern layer 2, a support layer 3, and a Re-Distribution Layer (RDL) 4. The conductive pattern layer 2 is arranged on the substrate 1. The support layer 3 covers the conductive pattern layer 2 and is provided with a via hole RDV. The RDL 4 is arranged on the support layer 3, and the RDL 4 includes a test pad 41 at least located in the via hole RDV. The test pad 41 includes a plurality of test contact portions 411 and a plurality of recesses 412 that are arranged alternately and connected mutually, and the recess 412 is in corresponding contact with a portion of the conductive pattern layer 2 in the via hole RDV.

It is to be noted that, in the embodiments of the disclosure, the substrate 1 is a substrate provided with an electrical device such as a transistor and/or a memory unit, and the embodiments of the disclosure do not specifically limit the electrical device included in the substrate 1. The RDL 4 is configured to be connected to the conductive pattern layer 2, and the conductive pattern layer 2 refers to a top conductive layer which has been provided before the RDL 4 is formed on the substrate 1, for example, a top metal layer. A pattern of the conductive pattern layer 2 may be arranged according to actual requirements, and the conductive pattern layer 2 includes, for example, a plurality of signal lines 21.

The support layer 3 covers the conductive pattern layer 2, and a material of support layer 3 may be at least one of silicon oxide, silicon nitride, or an organic insulating material. Exemplarily, the support layer 3 is a single layer of thin film or a stack of multiple layers of thin films.

Optionally, as shown in FIG. 1, the support layer 3 includes an organic material layer, such as a Tetraethyl orthosilicate (TEOS) layer, to ensure that the support layer 3 has a certain thickness.

Optionally, as shown in FIG. 2, the support layer 3 includes a silicon oxide layer 31, a silicon nitride layer 32, and an organic material layer 33 that are stacked in sequence along a direction away from the substrate 1. The organic material layer 33 is, for example, a TEOS layer, and the silicon oxide layer 31 can be prepared by performing a High Density Plasma (HDP) process on TEOS. A thickness of the organic material layer 33 is greater than a thickness of the silicon oxide layer 31 and/or that of the silicon nitride layer 32. For example, the thickness of the organic material layer 33 is greater than or equal to 4 µm, for example, is 4 µm, 4.5 µm, or 5 µm. The thickness of the silicon oxide layer 31 is greater than or equal to 0.5 µm, for example, is 0.5 µm, 0.8 µm, or 1 µm. The thickness of the silicon nitride layer 32 is greater than or equal to 0.5 µm, for example, is 0.5 µm, 0.6 µm, or 0.8 µm.

The via hole RDV penetrates the support layer 3 in a direction perpendicular to the substrate 1, so that part of the pattern of the conductive pattern layer 2 may be exposed in the via hole RDV. In some examples, a shape of an orthographic projection of the via hole RDV on the substrate 1 may be a rectangle, a square, a circle, or an ellipse, but is not limited thereto, for example, the shape of the orthographic projection of the via hole RDV on the substrate 1 may also be an irregular shape.

In addition, a size of the via hole RDV can be selected and set according to actual requirements. For example, a minimum size of the orthographic projection of the via hole RDV on the substrate 1 is greater than or equal to 10 µm, for example, is 10 µm or 20 µm, to ensure that the part, exposed in the via hole RDV, of the pattern of the conductive pattern layer 2 can meet the requirement of good electrical connection between the conductive pattern layer 2 and the RDL 4. Herein, the minimum size of the orthographic projection of the via hole RDV on the substrate 1 refers to a minimum value of sizes in different directions, of the shape of the orthographic projection of the via hole RDV on the substrate 1.

The RDL 4 is configured to change a position of an initial circuit contact point of the conductive pattern layer 2, and can be prepared by a wafer-level metal wiring process and a bump process, so that the semiconductor structure 100 is adaptable to different package forms. The embodiments of the disclosure only describe the test pad 41 and the bonding pad 42 in the RDL 4 in detail. For the parts other than the test pad 41 and the bonding pad 42 in the RDL 4, reference can be made to the relevant art.

Continuing to refer to FIG. 1 and FIG. 2, the RDL 4 includes the test pad 41 and the bonding pad 42. The test pad 41 is used for the WAT of the semiconductor structure 100. The bonding pad 42 is used for the coupling between the semiconductor structure 100 and an external electrical component. The number of the test pad 41 and the bonding pad 42 can be selected and set according to actual requirements, and the bonding pad 42 is coupled to the test pad 41 correspondingly.

In some examples, the test pad 41 is formed at least within the via hole RDV. For example, a portion of the RDL 4 located in the via hole RDV is the test pad 41; or, for another example, the portion of the RDL 4 located in the via hole RDV and a portion connected to the peripheral side of the aforementioned portion together form the test pad 41.

In some examples, the bonding pad 42 is coupled to the test pad 41 correspondingly, and an orthographic projection of the bonding pad 42 on the substrate 1 is located outside an orthographic projection of the corresponding test pad 41 on the substrate 1. For example, the test pad 41 is arranged in the via hole RDV; the bonding pad 42 is connected to the test pad 41, and the bonding pad 42 is arranged outside the via hole RDV, and has a certain distance from a boundary of the via hole RDV.

It is to be understood with reference to FIG. 1 and FIG. 2 that, the test pad 41, the bonding pad 42, and an interconnected part of the two may be formed by a conductive layer 40 in the RDL 4, the conductive layer 40, for example, is a single metal layer or a stack of multiple metal layers. In an example, the conductive layer 40 in the RDL 4 is a stack of a titanium (Ti) layer 401 and an aluminum (Al) layer 402, or a stack of a titanium (Ti) layer 401, an aluminum (Al) layer 402, and a titanium (Ti) layer 403. A thickness of the aluminum layer 402 is greater than a thickness of the titanium layer 401 and/or that of the titanium layer 403.

Continuing to refer to FIG. 1 and FIG. 2, the test pad 41 is located at least in the via hole RDV, and is composed of a plurality of test contact portions 411 and a plurality of recesses 412 in a manner that the test contact portions and the recesses are arranged alternately and connected mutually. The number of the test contact portions 411 and the recesses 412 in the test pad 41 can be selected and set according to actual requirements. The test contact portion 411 is configured to be in contact with a probe 7 in the WAT process, and the test contact portion 411 is a portion in the test pad 41, not lower than a surface, facing away from the substrate 1, of the support layer 3. The recess 412 is in corresponding contact with a portion of the conductive pattern layer 2 that is located in the via hole RDV, and the recess 412 is a portion in the test pad 41, not higher than the surface, facing away from the substrate 1, of the support layer 3.

In the case where the test pad 41 adopts a titanium (Ti) layer 401-aluminum (Al) layer 402-titanium (Ti) layer 403 structure, a thickness of the aluminum layer 402 in the recess 412 is related to the concave shape and size of the recess 412. Exemplarily, the thickness of the aluminum layer 402 in the recess 412 is greater than or equal to 1 µm, for example, is 1 µm, 1.2 µm, or 1.3 µm; a thickness of the titanium layer 401 and/or the titanium layer 403 in the recess 412 is greater than or equal to 0.1 µm, for example, is 0.1 µm, 0.3 µm, or 0.5 µm. Correspondingly, the thickness of the aluminum layer 402 in the test contact portion 411 and the thickness of the aluminum layer 402 in the bonding pad 42 can be set to be larger, for example, the thickness of the aluminum layer 402 is greater than or equal to 4 µm, for example, is 4 µm, 4.5 µm, 4.8 µm, or 5 µm.

In an embodiment of the disclosure, the test pad 41 is composed of a plurality of test contact portions 411 and a plurality of recesses 412 that are arranged alternately and connected mutually, so that the test contact portions 411 in the test pad 41 are arranged as an overhead grid. Thus, the test pad 41 in the RDL 4 may be directly arranged in an area where the via hole RDV is located, without an extra space reserved for accommodating the test pad, thereby facilitating further reduction of the size of the semiconductor structure 100. In addition, in a process of using the probe 7 to come in contact with the test pad 41 to perform the WAT, the probe 7 comes in contact with the test contact portion 411, the test contact portion 411 is connected to the recess 412, the recess 412 is then in contact with the conductive pattern layer 2, so that the testing of performances of the conductive pattern layer 2 by the probe 7 can be well achieved. As the probe 7 is usually inserted to the test pad 41 at a certain angle, in the embodiment of the disclosure, the test contact portions 411 of the test pad 4 are arranged as an overhead grid, which can ensure that a tip of the probe 7 is only inserted into the test contact portion 411, or a gas gap between adjacent test contact portions 411, thereby preventing a pressure of the probe 7 from acting on the conductive pattern layer 2 to cause defects such as deformation, short-circuit, or fracture of the conductive pattern layer 2, and further avoiding damage to the yield of the semiconductor structure 100 due to the WAT, so as to improve the yield of the semiconductor structure 100.

Figure 3:
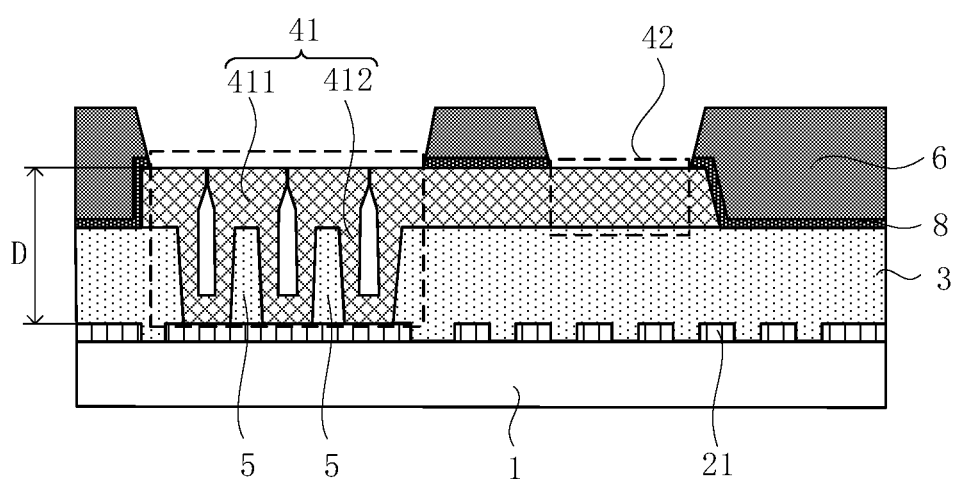
FIG. 3 is a schematic sectional view of still another semiconductor structure according to an embodiment.

It should be added that in some embodiments, there may also be electrical connection between adjacent test contact portions 411. For example, as shown in FIG. 3, tops of two adjacent test contact portions 411 are in contact with each other. In this way, the test pad 41 can have a larger test contact area to ensure a good electrical contact performance between the probe 7 and the test pad 41. Moreover, there is no air gap on a test contact surface of the test pad 41, which can further prevent the tip of the probe 7 from being inserted to the conductive pattern layer 2.

In other embodiments, a gap between tops of two adjacent test contact portions 411 is smaller than a gap between bottoms of the two adjacent test contact portions 411, as shown in FIG. 2. That is, the top of the test contact portion 411 has a bump facing the adjacent test contact portion 411, and a maximum protrusion size of the bump is greater than a threshold value. Optionally, the maximum protrusion size of the bump at the top of the test contact portion 411 is greater than 0.5 µm, for example, is 0.6 µm, 0.7 µm, 0.8 µm, or 1 µm. In this way, the test pad 41 can have a larger test contact area to ensure a good electrical contact performance between the probe 7 and the test pad 41. Moreover, there is only a small air gap on the test contact surface of the test pad 41, which can further prevent the tip of the probe 7 from being inserted to the conductive pattern layer 2.

The test pad 41 in the embodiments of the disclosure adopts the abovementioned structure, which may have various implementation modes.

Referring to FIG. 1, FIG. 2 and FIG. 3, in some embodiments, the semiconductor structure 100 further includes: a spacer 5 located in the via hole RDV. The number, shape, and distribution manner of the spacers 5 may be set according to the shape and distribution manner of the test contact portions 411. FIG. 1 and FIG. 2 are only used to illustrate that the spacer 5 is disposed in the via hole RDV, and not limit the number and size of the spacer 5.

Figure 4:
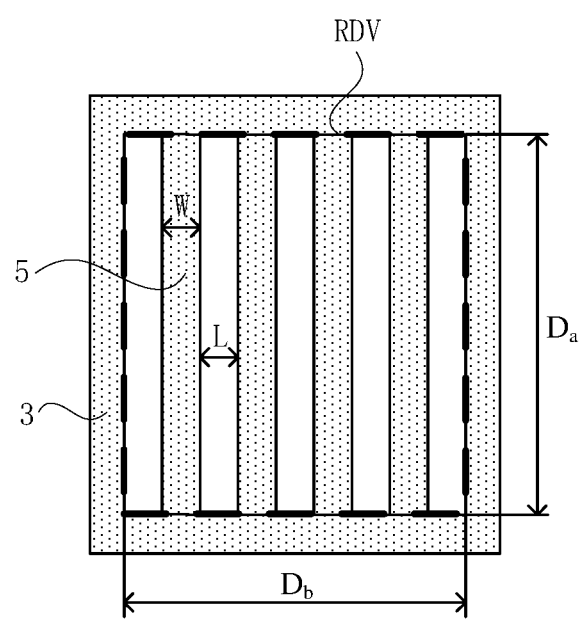
FIG. 4 is a schematic diagram of distribution of spacers in a via hole according to an embodiment.
Figure 5:
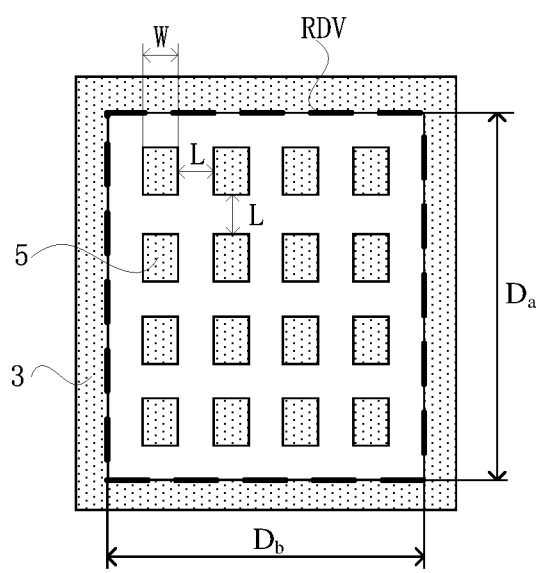
FIG. 5 is a schematic diagram of distribution of another spacers in a via hole according to an embodiment.

In a possible implementation mode, referring to FIG. 4 and FIG. 5, the semiconductor structure 100 includes a plurality of spacers 5 located in the via holes RDV, and an interval L is provided between any two adjacent spacers 5. The test pad 41 covers the spacers 5 and the interval L. The test contact portion 411 of the test pad 41 is correspondingly located on a surface, facing away from the substrate 1, of the spacer 5, and the recess 412 of the test pad 41 is correspondingly located in the interval L.

Exemplarily, as shown in FIG. 4, the orthographic projection of the via hole RDV on the substrate 1 is in the shape of a rectangle. The spacers 5 include strip-shaped spacers. A plurality of strip-shaped spacers are arranged in parallel at intervals, and two ends, in a length direction, of the strip-shaped spacer are respectively connected to side walls of the via hole RDV.

In addition, optionally, a minimum size of the orthographic projection of the via hole RDV on the substrate 1 is greater than or equal to 10 μm. For example, the shape of the orthographic projection of the via hole RDV on the substrate 1 is a rectangle, its long-side size $D_a$ is larger than its wide-side size $D_b$, then the wide-side size $D_b$ is greater than or equal to 10 μm, which is 10 μm, 15 μm, or 20 μm. Correspondingly, a width value of an orthographic projection of the strip-shaped spacer on the substrate 1 ranges from 6 μm to 10 μm, for example, is 6 μm, 8 μm, or 10 μm. A value of the interval L between two adjacent blocky spacers ranges from 6 μm to 10 μm, for example, is 6 μm, 8 μm, or 10 μm.

Exemplarily, as shown in FIG. 5, the shape of the orthographic projection of the via hole RDV on the substrate 1 is a rectangle. The spacers 5 include blocky spacers; and a plurality of blocky spacers are distributed in an array.

In addition, optionally, a minimum size of the orthographic projection of the via hole RDV on the substrate 1 is greater than or equal to 10 μm. For example, the shape of the orthographic projection of the via hole RDV on the substrate 1 is a rectangle, and its long-side size $D_a$ is larger than its wide-side size $D_b$, then the wide-side size $D_b$ is greater than or equal to 10 μm, which is 10 μm, 15 μm, or 20 μm. Correspondingly, a width value of an orthographic projection of the blocky spacer on the substrate 1 ranges from 6 μm to 10 μm, for example, is 6 μm, 8 μm, or 10 μm. A value of the interval L between two adjacent blocky spacers ranges from 6 μm to 10 μm, for example, is 6 μm, 8 μm, or 10 μm.

Figure 6:
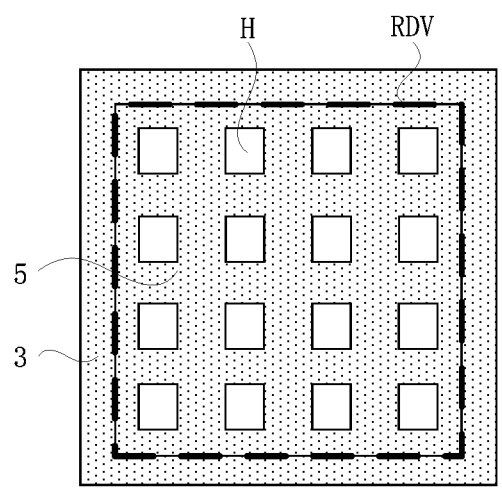
FIG. 6 is a schematic diagram of distribution of still another spacer in a via hole according to an embodiment.

In another possible implementation mode, referring to FIG. 6, the semiconductor structure 100 includes a spacer 5 that is located in the via hole RDV and hollowed out as a grid. The test pad 41 covers the spacer 5, the test contact portion 411 is correspondingly located on a surface, facing away from the substrate 1, of the spacer 5, and the recess 412 is correspondingly located in a hollow-out area H of the spacer 5. A shape of an orthographic projection of the hollow-out area H on the substrate 1 can be selected and set according to actual requirements, for example, is a long strip or a block.

In some embodiments, the surface, facing away from the substrate 1, of the spacer 5 is flush with a surface, facing away from the substrate 1, of the support layer 3, so that the plurality of test contact portions 411 of the test pad 41 have the same thickness to ensure the surfaces, facing away from the substrate 1, of the test contact portions 411 being flush with each other.

In some embodiments, a material of the spacer 5 includes at least one of silicon oxide, silicon nitride, or an organic insulating material.

In the case where the spacer 5 and the support layer 3 are made of the same material, the spacer 5 and the via hole RDV in the support layer 3 may be formed by one patterning process, thereby simplifying a preparation process of the semiconductor structure 100.

It can be understood that the RDL 4 is of the structure in the foregoing embodiments to facilitate further reduction of the size of the semiconductor structure 100. Therefore, the size design of the test pad 41 on the RDL 4 is required to meet requirements for both the size of the semiconductor structure 100 and the electrical measurement of the conductive pattern layer 2.

In some embodiments, a maximum size of an orthographic projection of the test pad 41 on the substrate 1 is greater than or equal to 50 μm, for example, is 50 μm, 60 μm or 80 μm.

Optionally, the portion, located in the via hole RDV, of the RDL 4 is the test pad 41, and a maximum size of an orthographic projection of the via hole RDV on the substrate 1 is greater than or equal to 50 μm, for example, is 50 μm, 60 μm, or 80 μm.

Optionally, a portion, located in the via hole RDV, of the RDL 4 and a portion connected to the peripheral side of the aforementioned portion together form the test pad 41, and the maximum size of the orthographic projection of the via hole RDV on the substrate 1 is less than 50 μm, for example, is 45 μm, 40 μm, or 35 μm.

In some embodiments, a distance D from a surface, facing away from the conductive pattern layer 2, of the test contact portion 411 to the conductive pattern layer 2 is greater than or equal to 5 μm, for example, is 5 μm, 6 μm, or 8 μm.

It is to be added that referring to FIG. 1, FIG. 2 and FIG. 3, the semiconductor structure 100 further includes a patterned dielectric layer 6 arranged on the RDL 4, and the test pad 41 and the bonding pad 42 in the RDL 4 are exposed in openings of the patterned dielectric layer 6. Thus, shapes of the test pad 41 and the bonding pad 42 may be accurately defined by a shape of the pattern of the patterned electric layer 6.

In some embodiments, referring to FIG. 2, a material of the patterned dielectric layer 6 may be at least one of silicon oxide, silicon nitride, or an organic insulating material. The patterned dielectric layer 6 may be a single layer of thin film or a stack of multiple layers of thin films. In the case where the patterned dielectric layer 6 includes the organic material layer, surface planarization of the semiconductor structure 100 can be achieved through the patterned dielectric layer 6.

Exemplarily, the patterned dielectric layer 6 includes a silicon nitride layer 61 and an organic material layer 62 sequentially stacked along a direction away from the substrate 1, the organic material layer 62 being, for example, a Polyimide (PI) layer. A thickness of the organic material layer 62 is greater than a thickness of the silicon nitride layer 61, for example, a minimum thickness of the organic material layer 62 is greater than or equal to 1.5 μm, for example, is 1.5 μm, 1.7 μm, 3 μm, or 5 μm; and a maximum thickness of the organic material layer 62 is greater than or equal to 5.5 μm, for example, is 5.5 μm, 6 μm, 7 μm, or 8 μm. The thickness of the silicon nitride layer 61 is greater than or equal to 0.2 μm, for example, is 0.2 μm, 0.3 μm or 0.5 μm.

In addition, continuing to refer to FIG. 2, in some embodiments, the semiconductor structure 100 further includes an adhesive layer 8 between the RDL 4 and the patterned dielectric layer 6, for enhancing an adhesion force between the patterned dielectric layer 6 and the RDL 4. Optionally, the adhesive layer 8 is a titanium nitride (TiN) layer. Thus, in the case where the conductive layer 40 in the RDL 4 includes a titanium layer 403, the adhesive layer 8 can be obtained by nitriding the titanium layer 403.

Figure 7:
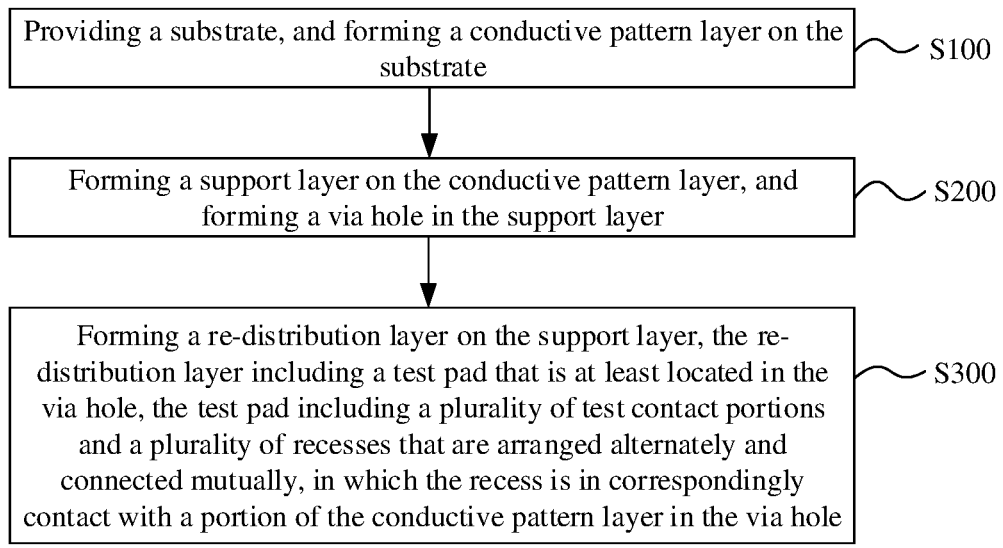
FIG. 7 is a flow chart of a method for preparing a semiconductor structure according to an embodiment.

Referring to FIG. 7, some embodiments of the disclosure further provide a method for preparing a semiconductor structure, to prepare the semiconductor structure 100 in the foregoing embodiments. The method for preparing a semiconductor structure includes the following steps.

At S100, a substrate is provided, and a conductive pattern layer is formed on the substrate.

At S200, a support layer is formed on the conductive pattern layer, and a via hole is formed in the support layer.

At S300, an RDL is formed on the support layer, the RDL including a test pad that is at least located in the via hole, the test pad including a plurality of test contact portions and a plurality of recesses that are arranged alternately and connected mutually, in which the recess is in corresponding contact with a portion of the conductive pattern layer in the via hole.

In the embodiments of the disclosure, the technical effect that can be achieved by the method for preparing a semiconductor structure is the same as that of the semiconductor structure in the foregoing embodiments, which will not be elaborated here.

Figure 8:
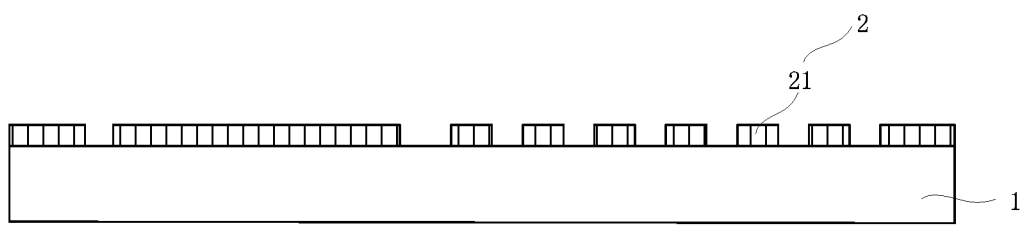
FIG. 8 is a schematic diagram of preparation of a conductive pattern layer according to an embodiment.

In some embodiments, S100 is as shown in FIG. 8, the substrate 1 is a substrate provided with an electrical device such as a transistor and/or a memory cell, and the embodiments of the disclosure do not specifically limit the electrical device included in the substrate 1. The conductive pattern layer 2 refers to a top conductive layer formed on the substrate 1, for example, a top metal layer. A pattern of the conductive pattern layer 2 may be provided according to actual requirements, and the conductive pattern layer 2 includes, for example, a plurality of signal lines 21.

Figure 9:
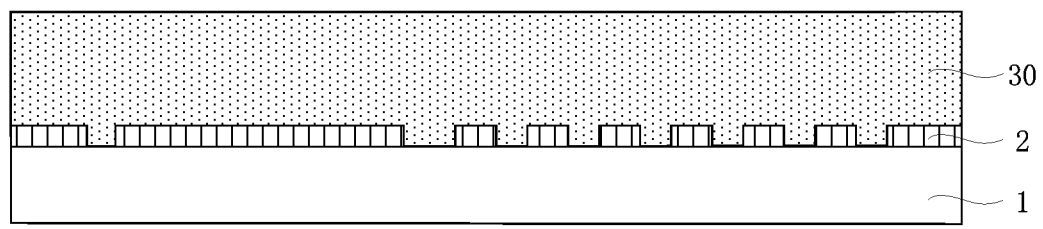
FIG. 9 is a schematic diagram of preparation of a via hole and a spacer according to an embodiment.
Figure 9:
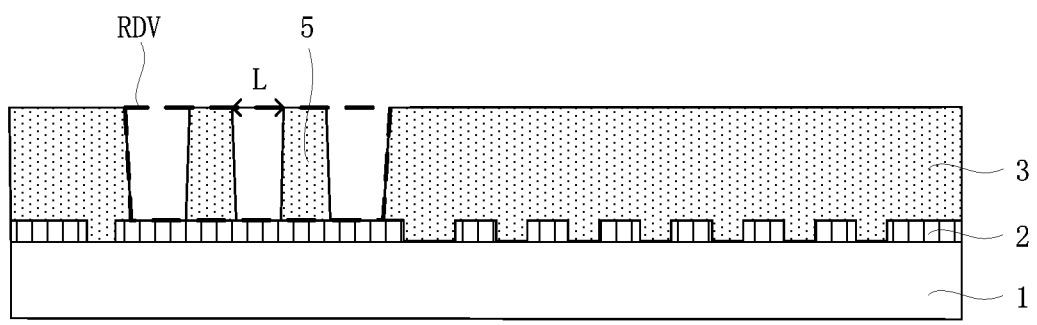
Figure 10:
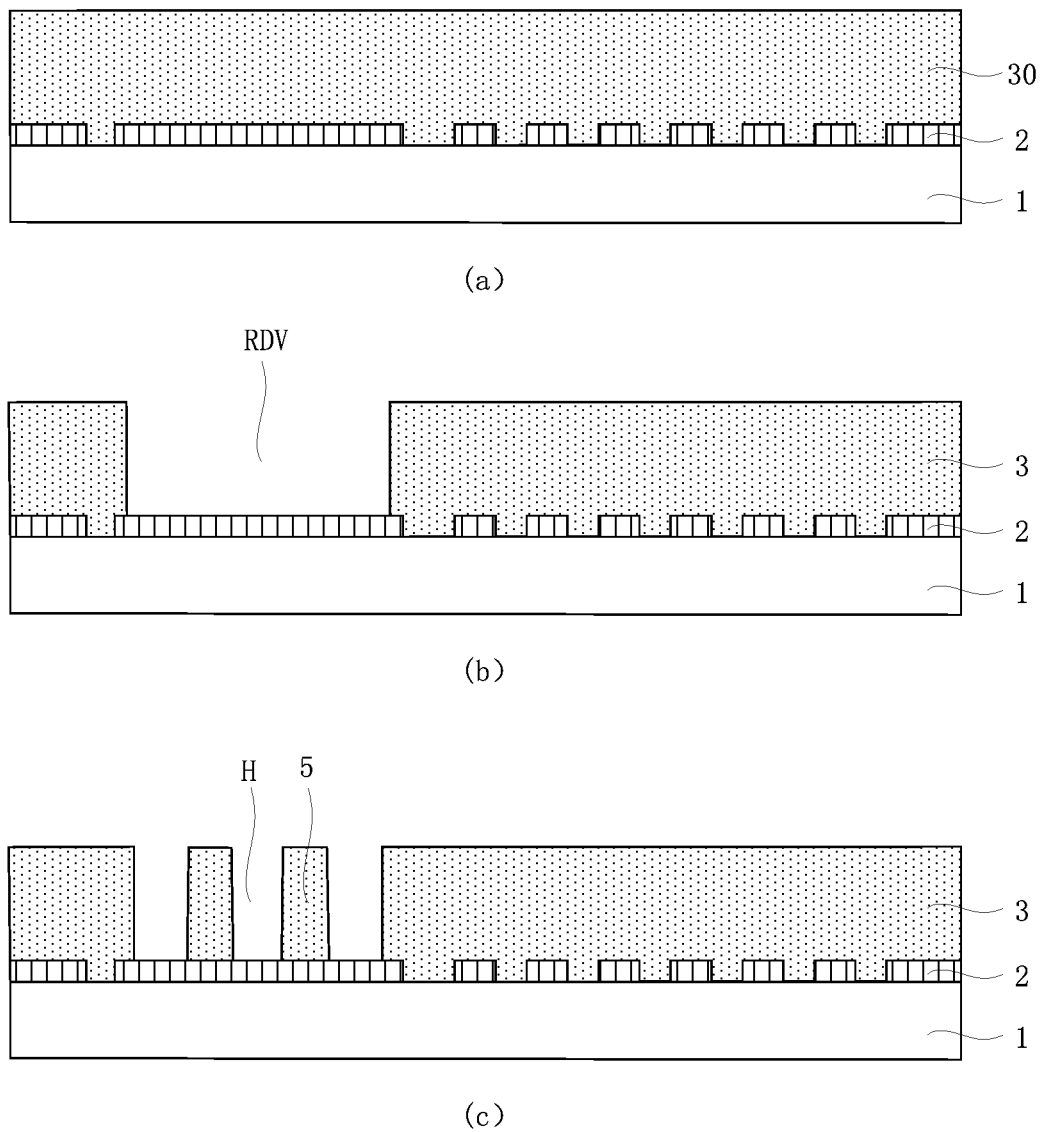
FIG. 10 is a schematic diagram of preparation of another via hole and another spacer according to an embodiment.

In some embodiments, referring to FIG. 9 and FIG. 10, at S200, the support layer 3 is formed on the conductive pattern layer 2, and a via hole RDV is formed in the support layer 3. A material of support layer 3 may be at least one of silicon oxide, silicon nitride, or an organic insulating material. The support layer 3 may be a single layer of thin film or a stack of multiple layers of thin films. Exemplarily, it is to be understood with reference to FIG. 2, FIG. 9 and FIG. 10 that, the support layer 3 includes a silicon oxide layer 31, a silicon nitride layer 32, and an organic material layer 33 that are sequentially stacked along a direction away from the substrate 1. The organic material layer 33 is, for example, a TEOS layer, and the silicon oxide layer 31 can be prepared by performing a High Density Plasma (HDP) process on a TEOS material.

In addition, the via hole RDV penetrates the support layer 3 in a direction perpendicular to the substrate 1, so that part of the pattern of the conductive pattern layer 2 may be exposed in the via hole RDV. Optionally, a shape of an orthographic projection of the via hole RDV on the substrate 1 may be a rectangle, a square, a circle, or an ellipse. Certainly, it is also allowed that the shape of the orthographic projection of the via hole RDV on the substrate 1 adopts an irregular shape. In addition, a size of the via hole RDV can be selected and set according to actual needs. For example, a minimum size of the orthographic projection of the via hole RDV on the substrate 1 is greater than or equal to 10 µm, for example, is 10 µm or 20 µm, to ensure that the part of the pattern of the conductive pattern layer 2 exposed in the via hole RDV can meet the requirement of good electrical connection between the conductive pattern layer 2 and the RDL 4. Herein, the minimum size of the orthographic projection of the via hole RDV on the substrate 1 refers to a minimum value of sizes in different directions, of the shape of the orthographic projection of the via hole RDV on the substrate 1.

In some embodiments, before S300 is performed, the method for preparing a semiconductor structure further includes forming a spacer in the via hole, to form the test contact portions and the recesses in the test pad through the spacer. Moreover, the number, shape, and distribution manner of the spacer may be set correspondingly according to the shape and distribution manner of the test contact portion.

In a possible implementation mode, referring to FIG. 4, FIG. 5, and FIG. 9, before the RDL 4 is formed on the support layer 3, the method for preparing a semiconductor structure further includes: forming a plurality of spacers 5 in the via hole RDV, an interval L being provided between any two adjacent spacers 5. Correspondingly, it is to be understood with reference to FIG. 9 and FIG. 11 that forming an RDL 4 on the support layer 3 at S300 includes: forming the test contact portion 411 at least on a surface, facing away from the substrate 1, of the spacer 5, and forming the recess 412 in the interval L.

Exemplarily, as shown in FIG. 4, forming a plurality of spacers 5 in the via hole RDV includes that a plurality of strip-shaped spacers that are arranged in parallel at intervals are formed in the via hole RDV, in which two ends, in a length direction, of the strip-shaped spacer are respectively connected to side walls of the via hole RDV. Here, for the structures of the via hole RDV and the strip-shaped spacers, reference may be made to the relevant descriptions in the foregoing embodiments.

Exemplarily, as shown in FIG. 5, forming a plurality of spacers 5 in the via hole RDV includes that a plurality of blocky spacers distributed in an array are formed in the via hole RDV. Here, for the structures of the via hole RDV and the blocky spacers, reference may be made to the relevant descriptions in the foregoing embodiments.

In addition, in some embodiments, as shown in FIG. 9, the via hole RDV and the spacer 5 may be formed by one patterning process. The patterning process is, for example, a photo-etching technology. In this way, the spacer 5 and the support layer 3 are made of the same material, and the surface, facing away from the substrate 1, of the spacer 5 may be flush with the surface, facing away from the substrate 1, of the support layer 3. Thus, the preparation process of the semiconductor structure 100 not only can be simplified, it is but also convenient to in the follow-up operation, the plurality of to make the plurality of test contact portions 411 of the test pad 41 have the same thickness in the follow-up operation, to ensure that the surfaces, facing away from the substrate 1, of the test contact portions 411 are flush with each other.

In another possible implementation mode, it is to be understood with reference to FIG. 6 and FIG. 10 that, before the RDL 4 is formed on the support layer 3, the method for preparing a semiconductor structure 100 further includes: forming a spacer 5 that is hollowed out as a grid in the via hole RDV. Correspondingly, it is to be understood with reference to FIG. 10 and FIG. 11 that forming an RDL 4 on the support layer 3 at S300 includes: forming the test contact portion 411 at least on a surface, facing away from the substrate 1, of the spacer 5, and forming the recess 412 in a hollow-out area H of the spacer 5.

In the embodiments of the disclosure, the spacer 5 may be formed after the via hole RDV is formed, and the material of the spacer 5 may be different from that of the support layer 3. In the case where the spacer 5 and the support layer 3 are made of the same material, the spacer 5 and the via hole RDV in the support layer 3 may also be formed by the one patterning process.

Figure 11:
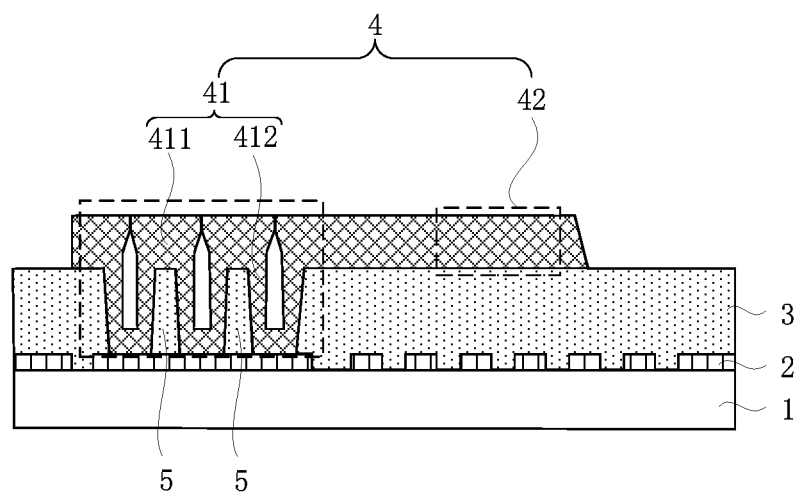
FIG. 11 is a schematic diagram of preparation of an RDL according to an embodiment.

Referring to FIG. 11, in some embodiments, the operation that an RDL 4 is formed on the support layer 3 further includes: forming a bonding pad 42 on the support layer 3, an orthographic projection of the bonding pad 42 on the substrate being located outside an orthographic projection of the test pad 41 on the substrate 1. For example, the test pad 41 is arranged in the via hole RDV; the bonding pad 42 is connected to the test pad 41, and the bonding pad 42 is arranged outside the via hole RDV, and has a certain distance from a boundary of the via hole RDV. In addition, for the structure of the test pad 41 and the bonding pad 42, reference may be made to related descriptions in the foregoing embodiments, which will not be elaborated here.

It can be understood that, the test pad 41, the bonding pad 42, and an interconnected part of the two may be formed by the conductive layer in the RDL 4, and the conductive layer, for example, is a single metal layer or a stack of multiple metal layers. In an example, the conductive layer in the RDL 4 is lamination of a titanium (Ti) layer and an aluminum (Al) layer, or a lamination of a titanium (Ti) layer, an aluminum (Al) layer, and a titanium (Ti) layer. A thickness of the aluminum layer is greater than a thickness of the titanium layer.

Figure 12:
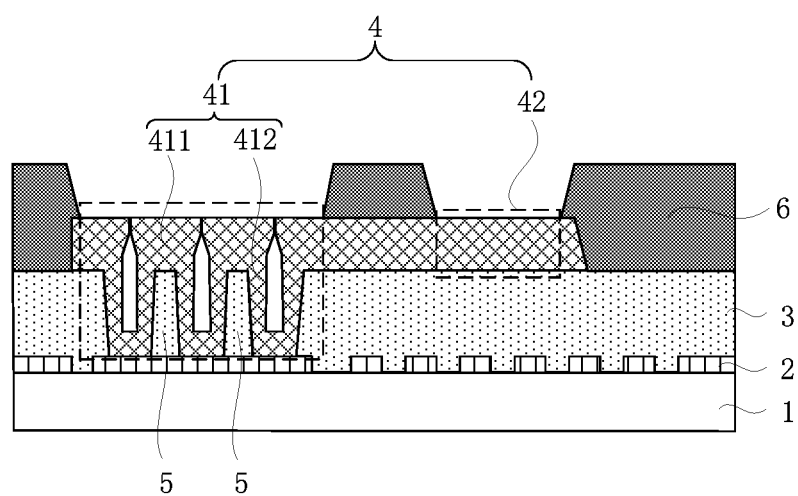
FIG. 12 is a schematic diagram of preparation of a dielectric layer according to an embodiment.

Based on this, referring to FIG. 12, the method for preparing a semiconductor structure further includes: forming a patterned dielectric layer 6 on a surface, facing away from the substrate 1, of the RDL 4, so that shapes of the test pad 41 and the bonding pad 42 are accurately defined through the pattern of the patterned dielectric layer 6.

In addition, optionally, a material of the patterned dielectric layer 6 may be at least one of silicon oxide, silicon nitride, or an organic insulating material. The patterned dielectric layer 6 may be a single layer of thin film or a stack of multiple layers of thin films. In the case where the patterned dielectric layer 6 includes the organic material layer, surface planarization of the semiconductor structure 100 can be achieved through the patterned dielectric layer 6.

In an example, it is to be understood with reference to FIG. 2 that, the semiconductor structure 100 further includes an adhesive layer 8 between the RDL 4 and the patterned dielectric layer 6, for enhancing an adhesion force between the patterned dielectric layer 6 and the RDL 4. Correspondingly, the operation that the patterned dielectric layer 6 is formed on the surface, facing away from the substrate 1, of the RDL 4 includes that: an adhesive material layer and a dielectric material layer are sequentially stacked and formed on the surface, facing away from the substrate 1, of the RDL 4, and are subjected to a patterning process so as to obtain an adhesive layer 8 and the patterned dielectric layer 6.

Optionally, the adhesive material layer includes a titanium nitride material layer. In the case where the conductive layer of the RDL 4 includes a titanium layer, the adhesive material layer can be obtained by nitriding the titanium layer.

Technical features of the above mentioned embodiments may be combined freely. For simplicity of description, not all possible combinations of technical features in the above mentioned embodiments are described. However, any combination of these technical features shall fall within the scope recorded in the specification unless there is any contradiction.

The above mentioned embodiments only express some implementation modes of the disclosure and are specifically described in detail, but cannot thus be understood as limitation to the patent scope of the disclosure. It is to be pointed out that those of ordinary skill in the art may further make a plurality of transformations and improvements without departing from the concept of the disclosure and all of these shall fall within the scope of protection of the disclosure. Therefore, the scope of patent protection of the disclosure should be subject to the appended claims.

DESCRIPTION ABOUT THE REFERENCE SIGNS

100—semiconductor structure, 1—substrate, 2—conductive pattern layer, 21—signal line, 3—support layer, 31—silicon oxide layer, 32—silicon nitride layer, 33—organic material layer, RDV-via hole,
4—Re-Distribution Layer (RDL), 41—test pad, 411—test contact portion, 412—recess, 42—bonding pad,
40—conductive layer, 401—titanium layer, 402—aluminum layer, 403—titanium layer, 5—spacer,
6—patterned dielectric layer, 61—silicon nitride layer, 62—organic material layer, 7—probe, 8—adhesive layer,
D—distance from surface, facing away from conductive pattern layer, of test contact portion to conductive pattern layer,
L—interval between adjacent spacers, W—width of orthographic projection of spacer on substrate, H—hollow-out area of spacer 5,
$D_a$—long-side size of orthographic projection of via hole on substrate, and $D_b$—wide-side size of orthographic projection of via hole on substrate.

What is claimed is:

1. A semiconductor structure, comprising:
a substrate;
a conductive pattern layer, arranged on the substrate;
a support layer, covering the conductive pattern layer and provided with a via hole; and
a re-distribution layer, arranged on the support layer;
the re-distribution layer comprising: a test pad at least located in the via hole; the test pad comprising a plurality of test contact portions and a plurality of recesses that are arranged alternately and connected mutually, wherein the recess is in corresponding contact with a portion of the conductive pattern layer in the via hole;
wherein
the support layer includes a silicon oxide layer, a silicon nitride layer, and an organic material layer that are stacked in sequence along a direction away from the substrate, and a thickness of the organic material layer is greater than a thickness of the silicon oxide layer and/or that of the silicon nitride layer; and
the re-distribution layer further comprises a bonding pad, wherein the bonding pad is coupled to the test pad through the test contact portion in the direction parallel to the substrate.

2. The semiconductor structure according to claim 1, wherein
a gap between tops of two adjacent ones of the test contact portions is smaller than a gap between bottoms of the two adjacent ones of the test contact portions; or
tops of two adjacent ones of the test contact portions are in contact with each other.

3. The semiconductor structure according to claim 1, further comprising:
a plurality of spacers in the via hole;
wherein
an interval is provided between any two adjacent ones of the spacers; and
the test pad covers the spacers and the intervals, the test contact portion is correspondingly located on a surface, facing away from the substrate, of the spacer, and the recess is correspondingly located in the interval.

4. The semiconductor structure according to claim 3, wherein
the spacers comprise strip-shaped spacers; a plurality of strip-shaped spacers are arranged in parallel at intervals, and two ends, in a length direction, of the strip-shaped spacer are respectively connected to side walls of the via hole; or the spacers comprise blocky spacers; and a plurality of blocky spacers are distributed in an array.

5. The semiconductor structure according to claim 4, wherein a width value of an orthographic projection of the spacer on the substrate ranges from 6 µm to 10 µm.

6. The semiconductor structure according to claim 1, further comprising:
  a spacer that is located in the via hole and hollowed out as a grid; and
  the test pad covers the spacer, the test contact portion is correspondingly located on a surface, facing away from the substrate, of the spacer, and the recess is correspondingly located in a hollow-out area of the spacer.

7. The semiconductor structure according to claim 3, wherein
  the surface, facing away from the substrate, of the spacer is flush with a surface, facing away from the substrate, of the support layer.

8. The semiconductor structure according to claim 1, wherein
  a shape of an orthographic projection of the via hole on the substrate comprises: a rectangle, a square, a circle, or an ellipse; and
  a minimum size of the orthographic projection of the via hole on the substrate is greater than or equal to 10 µm.

9. The semiconductor structure according to claim 1, wherein a maximum size of an orthographic projection of the test pad on the substrate is greater than or equal to 50 µm.

10. The semiconductor structure according to claim 1, wherein a distance from a surface, facing away from the conductive pattern layer, of the test contact portion to the conductive pattern layer is greater than or equal to 5 µm.

11. The semiconductor structure according to claim 1, an orthographic projection of the bonding pad on the substrate is located outside an orthographic projection of the test pad on the substrate.

12. The semiconductor structure according to claim 6, wherein
  the surface, facing away from the substrate, of the spacer is flush with a surface, facing away from the substrate, of the support layer.

13. A method for preparing a semiconductor structure, comprising: providing a substrate, and forming a conductive pattern layer on the substrate;
  forming a support layer on the conductive pattern layer, and forming a via hole in the support layer; and
  forming a re-distribution layer on the support layer, wherein the re-distribution layer comprises a test pad that is at least located in the via hole, the test pad comprising a plurality of test contact portions and a plurality of recesses that are arranged alternately and connected mutually, and wherein the recess is in corresponding contact with a portion of the conductive pattern layer in the via hole;
  wherein the support layer includes a silicon oxide layer, a silicon nitride layer, and an organic material layer that are stacked in sequence along a direction away from the substrate, and a thickness of the organic material layer is greater than a thickness of the silicon oxide layer and/or that of the silicon nitride layer; and
  wherein forming a re-distribution layer on the support layer further comprises:
  forming a bonding pad on the support layer, wherein the bonding pad is coupled to the test pad through the test contact portion in the direction parallel to the substrate.

14. The method for preparing a semiconductor structure according to claim 13, wherein
  the method, before forming the re-distribution layer on the support layer, further comprises: forming a plurality of spacers in the via hole, wherein an interval is provided between any two adjacent ones of the spacers; and
  said forming a re-distribution layer on the support layer comprises: forming the test contact portion at least on a surface, facing away from the substrate, of the spacer, and forming the recess in the interval.

15. The method for preparing a semiconductor structure according to claim 14, wherein
  said forming a plurality of spacers in the via hole comprises:
forming a plurality of strip-shaped spacers that are arranged in parallel at intervals in the via hole, wherein two ends, in a length direction, of the strip-shaped spacer are respectively connected to side walls of the via hole; or
  forming in the via hole a plurality of blocky spacers that are distributed in an array.

16. The method for preparing a semiconductor structure according to claim 13, wherein
  the method, before forming the re-distribution layer on the support layer, further comprises: forming in the via hole a spacer that is hollowed out as a grid; and
  said forming a re-distribution layer on the support layer comprises: forming the test contact portion at least on a surface, facing away from the substrate, of the spacer, and forming the recess in a hollow-out area of the spacer.

17. The method for preparing a semiconductor structure according to claim 14, wherein
  the via hole and the spacer are formed by one patterning process.

18. The method for preparing a semiconductor structure according to claim 13, wherein an orthographic projection of the bonding pad on the substrate is located outside an orthographic projection of the test pad on the substrate.

* * * * *